(12) United States Patent
Wilford (10) Patent No.: US 6,219,283 B1
(45) Date of Patent: Apr. 17, 2001

(54) MEMORY DEVICE WITH LOCAL WRITE DATA LATCHES

(75) Inventor: John R. Wilford, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,472

(22) Filed: Sep. 3, 1998

(51) Int. Cl.[7] .................................................. G11C 7/00
(52) U.S. Cl. ................................... 365/189.05; 711/3
(58) Field of Search ................................ 710/35; 711/3; 365/189.05

(56) References Cited

U.S. PATENT DOCUMENTS

| | | | |
|---|---|---|---|
| 4,825,416 | 4/1989 | Tam | 365/194 |
| 5,261,064 | 11/1993 | Wyland | 395/400 |
| 5,327,390 | 7/1994 | Takasugi | 365/230 |
| 5,361,343 | 11/1994 | Kosonocky et al. | 395/425 |
| 5,390,149 * | 2/1995 | Vogley et al. | 365/189.05 |
| 5,617,555 | 4/1997 | Patel et al. | 395/432 |
| 5,623,624 | 4/1997 | Holland et al. | 395/432 |
| 5,721,859 | 2/1998 | Manning | 398/421.07 |
| 5,787,489 | 7/1998 | Pawlowski | 711/169 |
| 5,978,311 | 11/1999 | Wilford et al. | 365/233 |

OTHER PUBLICATIONS

"2.25Mb ZBT SRAM Product Specification", *Micron Technology, Inc.*, (Sep 1997).

"Synchburst SRAM Product Guide", *Micron Technology, Inc.*, (Feb. 1998).

* cited by examiner

*Primary Examiner*—Jack A. Lane
(74) *Attorney, Agent, or Firm*—Schwegman, Lundberg, Woessner & Kluth, P.A.

(57) ABSTRACT

A static random access memory device includes a plurality of local latch circuits coupled between a data communication line and a common memory array block. The local latch circuits allow a series of data signals to be received on the data communication line and latched for writing to the memory array block in one memory write operation. The local latch circuits provide for a burst of data to be written in a single memory array block in a single write operation.

20 Claims, 6 Drawing Sheets

MEMORY DEVICE WITH LOCAL WRITE DATA LATCHES

TECHNICAL FIELD OF THE INVENTION

The present invention relates generally to memory devices and in particular the present invention relates to a static memory device which includes latch circuitry to minimize memory array blocks.

BACKGROUND OF THE INVENTION

The performance of computer systems, especially personal computers, has improved dramatically due to the rapid growth in computer architecture design, and in particular, to the performance of computer memory. The speed with which a processor can access data is critical to its performance, while providing uniformly fast memory access can be cost prohibitive. To get around this problem, computer architectures have relied on a mix of fast, less dense, memory and slower bulk memory. In fact, many computer architectures have a multilevel memory architecture in which an attempt is made to find information in the fastest memory. If the information is not in that memory, a check is made at the next fastest memory. This process continues down through the memory hierarchy until the information sought is found. One critical component in such a memory hierarchy is a cache memory.

Cache memories rely on the principle of locality to attempt to increase the likelihood that a processor will find the information it is looking for in the cache memory. To do this, cache memories typically store contiguous blocks of data. In addition, the cache memory stores a tag which is compared to an address to determine whether the information the processor is seeking is present in the cache memory. Cache memories are usually constructed from higher speed memory devices such as static random access memory (SRAM). The typical cache memory transfers a cache line as a contiguous block of data, starting at the first word in the cache line and proceeding through to the last. Each of the bits of a cache line is typically stored in a different memory array block using one write operation. As such, numerous blocks of memory must be accessed for writing a line of data.

For the reasons stated above, and for other reasons stated below which will become apparent to those skilled in the art upon reading and understanding the present specification, there is a need in the art for an SRAM which can store a line of data in a single memory array block while maintaining a minimum number of input data lines.

SUMMARY OF THE INVENTION

The above mentioned problems with high speed memory devices and other problems are addressed by the present invention and will be understood by reading and studying the following specification. A memory is described which includes local data latches coupled to columns of a memory array.

In one embodiment, the present invention describes a static random access memory device comprising a memory array block having rows and columns of memory cells, a data communication line for receiving input data, and a plurality of local latch circuits coupled between the data communication line and the memory array block. A series of data signals received on the data communication line can be latched in the plurality of local latch circuits for writing to the memory array block in one memory write operation.

In another embodiment, static random access memory device is described which comprises a memory array block having rows and columns of memory cells, and address circuitry for receiving an externally provided memory array address and generating a series of additional memory array addresses. The externally provided memory array address and the series of additional memory array addresses form a burst address sequence. The static random access memory device further comprises a data communication input for receiving a series of input data, a plurality of local latch circuits coupled between the data communication input and the memory array block, and coupling circuitry for coupling the series of input data to the memory array block in one memory write operation after the series of input data is latched in the plurality of local latch circuits.

In another embodiment a method of operating a memory device is described. The method comprises receiving a series of data input signals, receiving an externally provided memory array start address, generating a plurality of additional memory array addresses in response to the memory array start address, sequentially activating a plurality of local latch circuits to latch a portion of the data input signals, and writing the latched portions of the data input signals to a common memory array block in one write operation.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

A local data latch architecture is provided to allow write data to be queued for writing to memory. This architecture is particularly useful in SRAM memories which are being operated as a cache memory, but can be implemented in any memory device which operates in a burst fashion. Some cache operation specifications require that an entire line of memory be read or written before a new memory address can be presented to the memory. Further, it is desirable to have large memory cell blocks to decrease die size.

Figure 1:
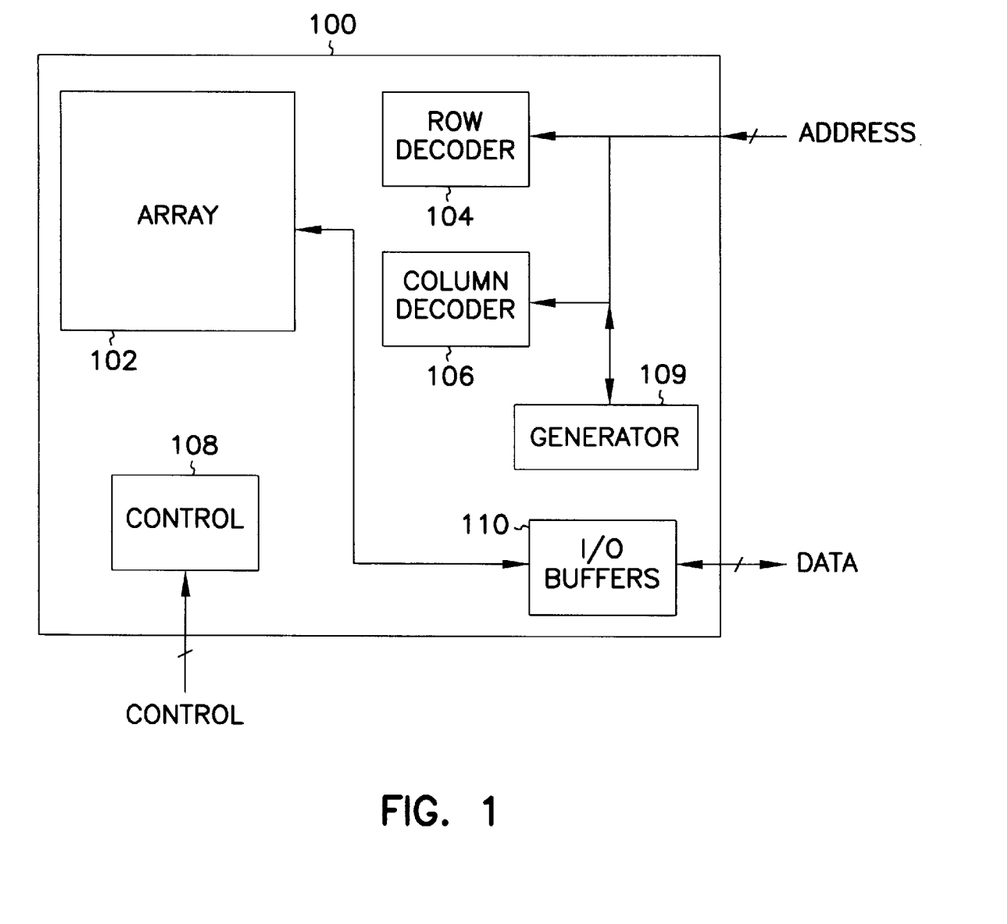
FIG. 1 is a block diagram of a static memory device.

Referring to FIG. 1, a static memory 100 includes a memory array 102 constructed of rows and columns of static memory cells. Row decode circuit 104 and column 106 decode circuitry is provided to access the memory array in response to an address provided by an external controller, such as a microprocessor. Control circuitry 108 is provided to control either synchronous or asynchronous data communication between the memory 100 and external devices. I/O data buffers 110 are coupled to the data communication lines (DQ's) for bi-directional data communication with the memory array 102. The SRAM can be operated in a burst mode using address generator circuit 109 to provide a series of address in response to an externally provided start address. It will be appreciated that the description of SRAM 100 has been simplified to focus on specific features of the present invention and is not intended to be a detailed description of all the circuitry of a basic SRAM.

Memory array 102 is arranged in rows and columns of memory cells. The columns are defined by a pair of bit lines which communicate data stored in the memory cells to the sense amplifier circuits. The bit lines are complements of each other such that in an active state one bit line will be at a low signal level and the other bit line will be at a high signal level.

Figure 2:
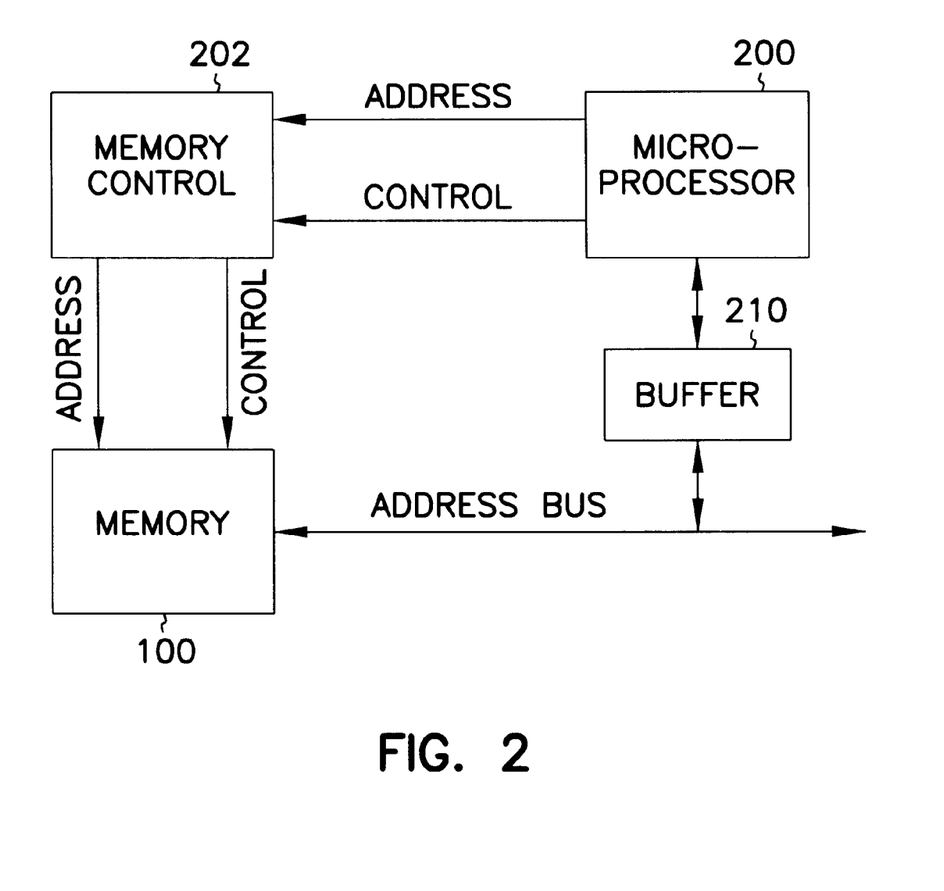
FIG. 2 is a block diagram of a data processing system.

FIG. 2 is a schematic representation of a data processing apparatus designed in accordance with the present invention. In FIG. 2, microprocessor 200 is connected via address lines and control lines to a memory control circuit 202. The memory control circuit provides address and control signals to a memory device 100. The memory device sends and receives data over a data bus. Optional data bus buffer 210 between the memory data bus and the microprocessor data bus allows for amplification of the data signals, and/or synchronization with the microprocessor and memory control signals. A fast static random access memory (SRAM) cache circuit 100 provides higher speed access to data stored in the cache from the memory control circuit or the microprocessor. It will be appreciated that the memory control circuit 202 may be incorporated within the microprocessor.

Figure 3:
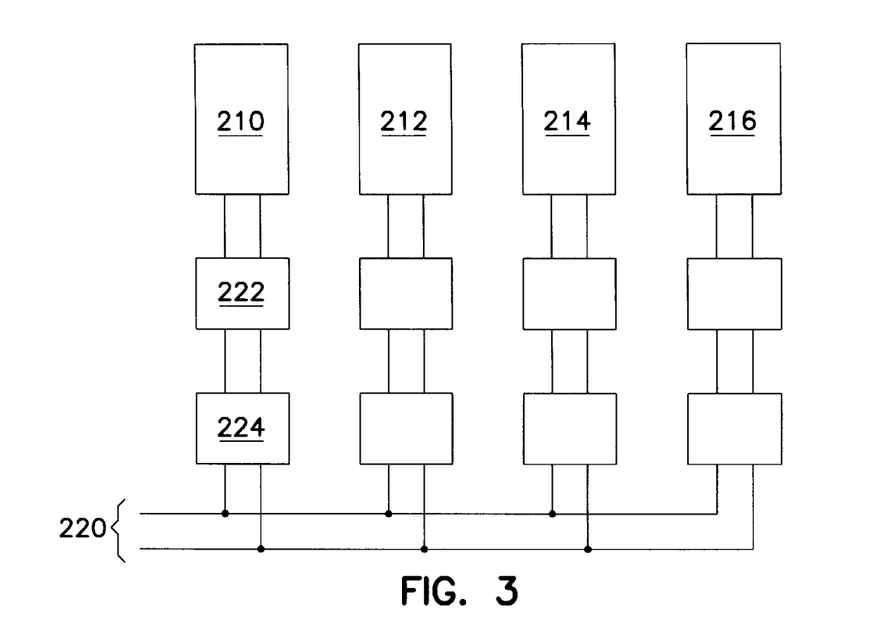
FIG. 3 is a memory device which has a plurality of memory array blocks.

Referring to FIG. 3, a memory device is illustrated which has a plurality of memory array blocks 210, 212 and 214 and 216. Each array block is coupled to a complementary data bus 220 through column pass circuitry 222 and write pass circuitry 224. If the memory is operated in a burst mode, a separate memory array block is required for each address in the burst address sequence. This is assuming that the sequence of data is to be written in one operation. As known to those skilled in the art, a burst mode uses an externally provided starting address and advances the starting address using internally generated addresses to either "burst" read or write data to a series of addresses. Thus, a burst line of two addresses can be written using the single complementary data bus, but at least two arrays are required. The data can be written in a common memory array block, however, if the data bits in a burst sequence is written after the receipt of each data bit. This option requires substantial power, and is not an attractive option.

Figure 4:
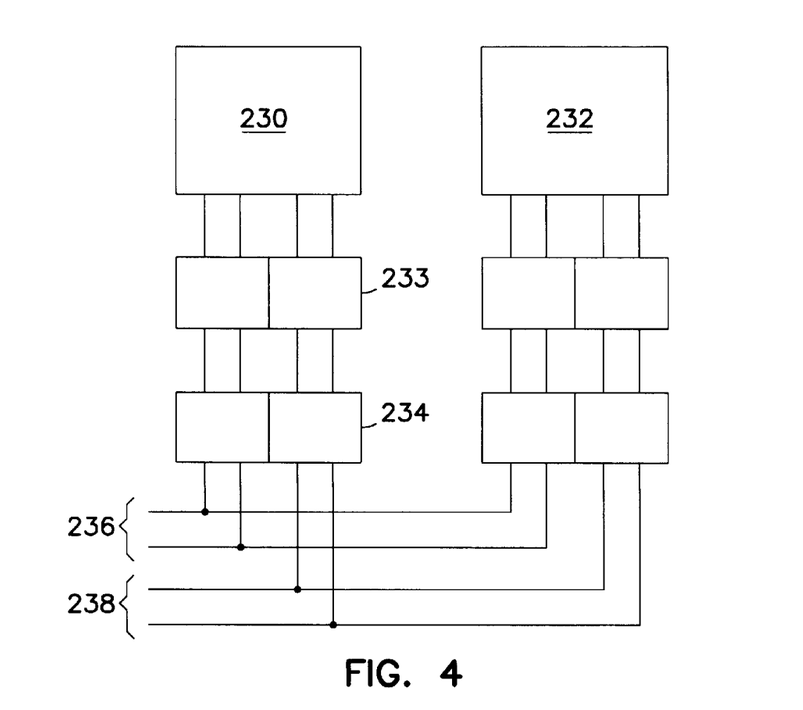
FIG. 4 is a memory device which has a plurality of memory array blocks and a plurality of data communication line pairs.

Alternately, the array blocks could be reduced if the number of data buses were increased, as illustrated in FIG. 4. The memory includes two array blocks 230 and 232, column pass circuitry 233 and write pass circuitry 234. Note that two pairs of complementary data buses are provided, 236 and 238. Thus, a burst line having a length of two addresses can be provided in one array, but two data buses would be required. It will be appreciated that for burst lengths of eight addresses, either a significant number of memory arrays or data buses would be required with the memories of FIGS. 3 or 4.

Figure 5:
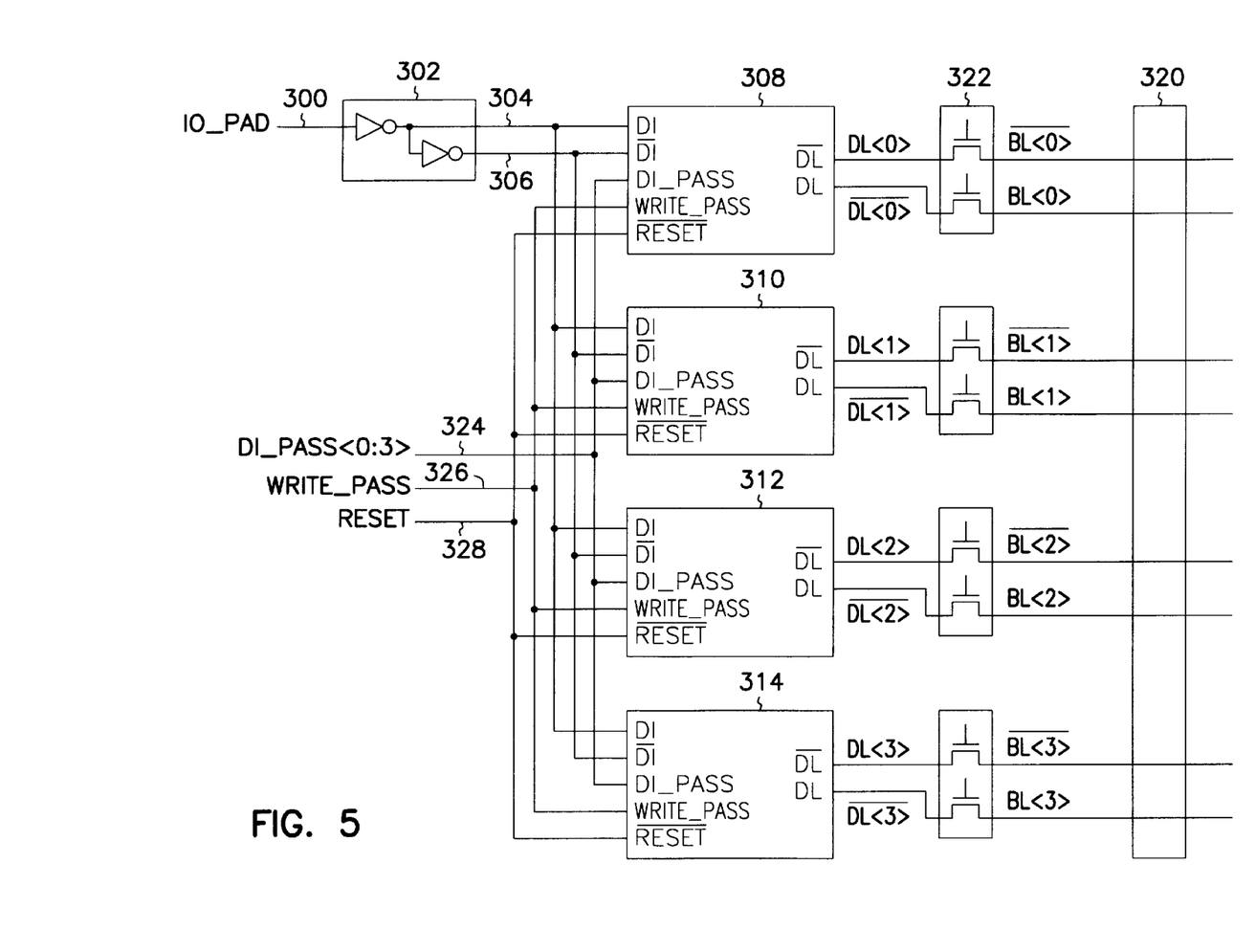
FIG. 5 is a block diagram of one embodiment of a memory incorporating the present invention.

Memory 100, of FIG. 1, has a reduced number of memory array blocks and a minimal width data bus. The memory includes data latches which are used to latch data provided on a common data bus and directed to the same array block. As such, a minimum number of array blocks and minimum data buses are required to implement a memory device which processes an entire burst line prior to receiving a new burst address. FIGS. 5 illustrates one embodiment of the latch circuitry provided in the present memory device. This embodiment includes a single data communication input, or bus, 300 which is inverted by inverter circuit 302 to provide complementary data signals on a pair of complementary bus outputs 304 and 306. The complementary data signals are selectively coupled to any of four latch circuits 308, 310, 312 and 314. The latch circuits are coupled to the memory cells or columns of an array block 320 via column pass devices 322. As such, each memory array block 320 has a plurality of local data latch circuits which are selectively coupled to columns of the memory array block. As explained below, the local data latches allow a line of data to be latched using a single data input pair (complementary signals) and written to a memory block in a single write operation.

Figure 6:
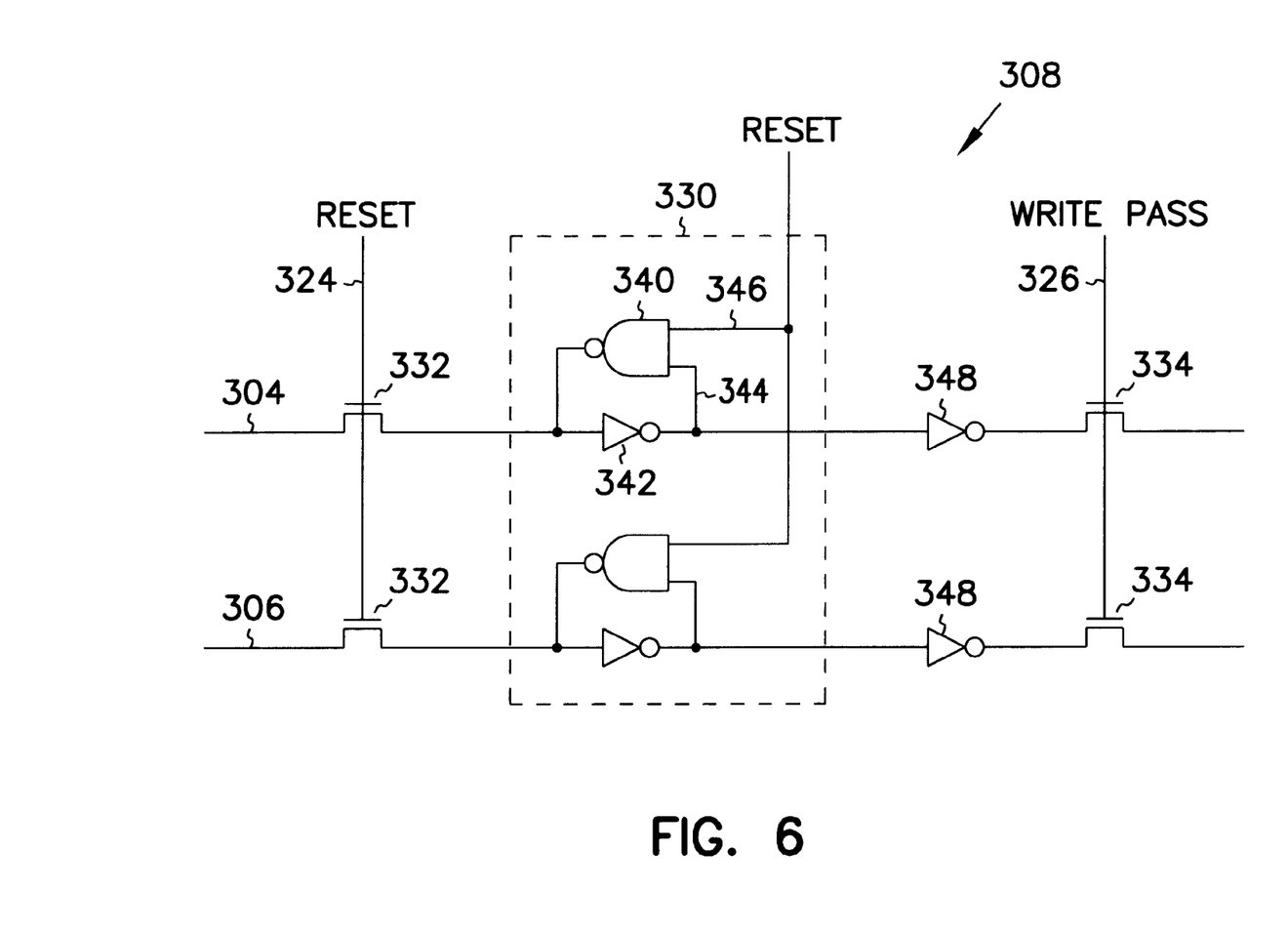
FIG. 6 is a schematic diagram of one embodiment of a latch circuit.

One embodiment of the latch circuit 308 is illustrated in FIG. 6. The circuitry includes a latch 330, pass transistors 332, and write pass transistors 334. The pass transistors are used to selectively couple the data inputs 304 and 306 to the latch circuit in response to an input signal on line 324, while the write pass transistors are used to selectively couple the latch 330 to the memory array in response to an input signal on line 326. Each latch circuit 330 includes a NAND gate 340 and an inverter 342. The NAND gate has one input 344 operating as a feedback path, while the other input 346 is used to reset the latch circuit to a predetermined output logic level. During operation, a low reset signal (input 328) forces the output of the NAND gate high and the latch circuit inverter output low. A second inverter 348 is provided to allow the signal provided to the write pass transistor to follow the input of the latch. Thus, when the reset signal is high, the output of invertor 348 follows the latch input.

Figure 7:
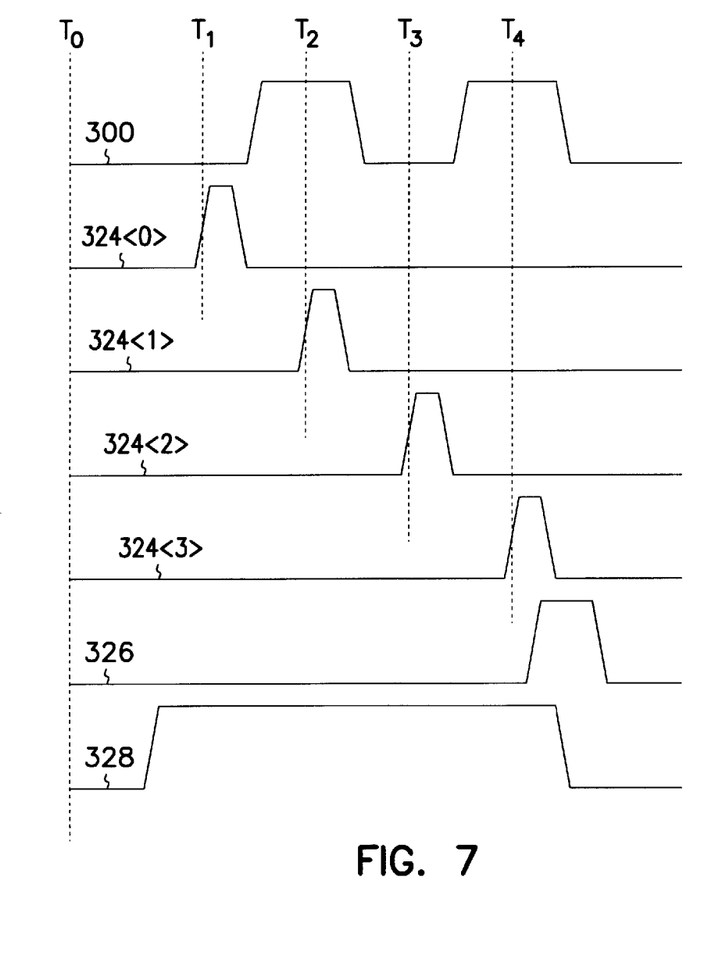
FIG. 7 is a timing diagram of the operation of the memory of FIG. 5.

A timing diagram of a burst write operation performed on the memory circuitry of FIG. 5 is provided in FIG. 7. At time T0 the reset signal 328 is low. The output connections (DL and DL*) of the four latch circuits 308–314, therefore, is low. When the reset signal transitions high, the latch circuits are free to follow their input signals. As illustrated, each of the four pass transistor gate signals, Pass 324<0:3>, are sequentially activated high to couple the data signal from 300 (or 306) to its respective latch 308–314. In this example, low, high, low and high signals provided on 300 and 306 are latched in latches 308, 310, 312 and 314, respectively. At Time $T_1$, latch 308 is activated to latch data from lines 304 and 306. Latch 310 is activated at Time $T_2$ to latch the input data. Likewise, latch 312 and 314 are activated at times $T_3$ and $T_4$, respectively. At time $T_4$, therefore, a line of data is latched in the local latches and can be written to the memory array block in one write operation. After the last pass transistor has been activated (324<3>), the write pass transistors 334 of all the latch circuits are activated by a high transition of signal 326. This allows the entire line of data latched in the four latches to be written to the memory array in a single write operation. The reset signal can then transition low to reset the latch circuits. It will be appreciated by those skilled in the art that the column pass devices are operated to maintain isolation between the latch outputs and the memory array bit lines while the latch output is reset. Further, the pass transistors 332 can remain inactivated if a write mask operation is desired. That is, if a user desires not to write to some locations, the pass transistors 332 remain off in response to Pass 324<0:3> and the reset signal insures that the output signals are latched in a reset state.

CONCLUSION

A memory device has been described which includes a plurality of local latch circuits coupled between a data communication line and a common memory array block. The local latch circuits allow a series of data signals to be received on the data communication line and latched for writing to the memory array block in one memory write operation. Thus, a reduced number of data lines can be used while writing a burst line of data in a single memory array block in a single write operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A static random access memory device comprising:
   a memory array block having rows and columns of memory cells;
   a data communication line for receiving input data; and
   a plurality of local latch circuits coupled between the data communication line and the memory array block, such that a series of data signals received on the data communication line is latched in the plurality of local latch circuits for writing to the memory array block in one memory write operation; and
   wherein a burst line of at least two addresses can be provided on a single data communication line to a single memory array block.

2. The static random access memory device of claim 1 wherein each of the plurality of local latch circuits comprise:
   an inverter; and
   a logic gate coupled to the inverter for providing a feedback path and resetting an output of the local latch circuit to a predetermined logic level.

3. The static random access memory device of claim 1 further comprising pass transistors coupled between the data communication line and the plurality of local latch circuits for selectively coupling the data communication line to the plurality of local latch circuits.

4. The static random access memory device of claim 1 further comprising write transistors coupled between the plurality of local latch circuits and the memory array block for selectively coupling the plurality of local latch circuits to the memory array block.

5. The static random access memory device of claim 1 further comprising column pass transistors coupled between the plurality of local latch circuits and the memory array block for selectively coupling the plurality of local latch circuits to a column of the memory array block.

6. A static random access memory device comprising:
   a memory array block having rows and columns of memory cells;
   address circuitry for receiving an externally provided memory array address and generating a series of additional memory array addresses, wherein the externally provided memory array address and the series of additional memory array addresses form a burst address sequence having at least two addresses;
   a data communication input for receiving a series of input data including a burst address sequence having at least two addresses;
   a plurality of local latch circuits coupled between the data communication input and the memory array block, such that the series of data signals received on the data communication input is latched in the plurality of local latch circuits for writing to the memory array block defined by the burst address sequence; and
   coupling circuitry for coupling the series of input data to a single memory array block in one memory write operation after the series of input data is latched in the plurality of local latch circuits.

7. The static random access memory device of claim 6 wherein the coupling circuitry comprises a plurality of write pass transistors coupled between the plurality of local latch circuits and the memory array block for selectively coupling the plurality of local latch circuits to the memory array block.

8. The static random access memory device of claim 6 wherein each of the plurality of local latch circuits comprise:
   an inverter; and
   a NAND gate coupled to the inverter for providing a feedback path and resetting an output of the local latch circuit to a predetermined logic level.

9. The static random access memory device of claim 6 further comprising pass transistors coupled between the data communication input and the plurality of local latch circuits for selectively coupling the data communication input to the plurality of local latch circuits.

10. The static random access memory device of claim 6 wherein the data communication input is a pair of complementary data communication lines.

11. The static random access memory device of claim 6 wherein the burst address sequence is four addresses long, and the static random access memory device comprises four local latch circuits wherein the four local latch circuits respectively latch data for the four memory array block addresses.

12. The static random access memory device of claim 6 wherein the burst address sequence is N addresses long, and the static random access memory device comprises N local latch circuits wherein the N local latch circuits respectively latch data for the N memory array block addresses.

13. A method of operating a memory device, the method comprising:
   receiving a series of data input signals;
   receiving an externally provided memory array start address;
   generating a plurality of additional memory array addresses in response to the memory array start address;
   sequentially activating a plurality of local latch circuits to latch a portion of the series of data input signals including a burst line of at least two addresses; and
   writing the latched portions of the data input signals to a single memory array block in one write operation.

14. The method of claim 13 wherein the plurality of local latch circuits are activated by turning off a reset signal and selectively activating a pass transistor coupled between the local plurality of local latch circuits and a data input.

15. The method of claim 13 wherein the latched portions of the data input signals are written to the common memory array block by activating a plurality of write transistors located between the plurality of local latch circuits and the common memory array block.

16. A data processing system comprising:
   a memory controller; and
   a static random access memory device comprising:

a memory array block having rows and columns of memory cells;

a data communication line for receiving input data;

a plurality of local latch circuits coupled between the data communication line and the memory array block, the plurality of local latch circuits each comprise an inverter, and a logic gate coupled to the inverter for providing a feedback path and resetting an output of the local latch circuit to a predetermined logic level, wherein a series of data signals including a burst line of at least two addresses received on the data communication line is latched in the plurality of local latch circuits such that the burst line can be written to a single memory array block in one memory write operation;

pass transistors coupled between the data communication line and the plurality of local latch circuits for selectively coupling the data communication line to the plurality of local latch circuits; and write transistors coupled between the plurality of local latch circuits and the memory array block for selectively coupling the plurality of local latch circuits to the memory array block.

17. A static random access memory device comprising:

a memory array block having rows and columns of memory cells;

a data communication line for receiving input data; and a plurality of local latch circuits coupled between a single data communication line and a single memory array block, such that a series of data signals having at least two addresses received on the single data communication line is latched in the plurality of local latch circuits for writing to the single memory array block in one memory write operation, wherein each of the plurality of local latch circuits comprise an inverter, and a logic gate couple to the inverter for providing a feedback path and resetting an output of the local latch circuit to a predetermined logic level.

18. The static random access memory device of claim 17 further comprising pass transistors coupled between the data communication line and the plurality of local latch circuits for selectively coupling the data communication line to the plurality of local latch circuits.

19. A static random access memory device comprising:

a memory array block having rows and columns of memory cells;

address circuitry for receiving an externally provided memory array address and generating a series of additional memory array addresses, wherein the externally provided memory array address and the series of additional memory array addresses form a burst address sequence;

a data communication input for receiving a series of input data;

a plurality of local latch circuits coupled between a single data communication input and a single memory array block, such that the series of data signals having at least two addresses received on the single data communication input is latched in the plurality of local latch circuits for writing to the single memory array block defined by the burst address sequence; and coupling circuitry for coupling the series of input data to the memory array block in one memory write operation after the series of input data is latched in the plurality of local latch circuits, the coupling circuitry comprises a plurality of write pass transistors coupled between the plurality of local latch circuits and the memory array block for selectively coupling the plurality of local latch circuits to the memory array block.

20. The static random access memory device of claim 19 wherein each of the plurality of local latch circuits comprise:

an inverter; and a NAND gate coupled to the inverter for providing a feedback path and resetting an output of the local latch circuit to a predetermined logic level.

* * * * *

UNITED STATES PATENT AND TRADEMARK OFFICE
CERTIFICATE OF CORRECTION

PATENT NO. : 6,219,283 B1
DATED : April 17, 2001
INVENTOR(S) : Wilford

It is certified that error appears in the above-identified patent and that said Letters Patent is hereby corrected as shown below:

Column 7,
Line 37, delete "couple" and insert -- coupled --, therefor.

Signed and Sealed this

Sixth Day of November, 2001

Attest:

NICHOLAS P. GODICI
Attesting Officer
Acting Director of the United States Patent and Trademark Office